United States Patent
Teusch

(10) Patent No.: US 9,781,856 B2
(45) Date of Patent: Oct. 3, 2017

(54) CONTROL UNIT FOR A MOTOR VEHICLE WITH A SHOCK HAZARD PROTECTION COVER

(71) Applicant: Robert Bosch GmbH, Stuttgart (DE)

(72) Inventor: Stefan Teusch, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 123 days.

(21) Appl. No.: 14/778,516

(22) PCT Filed: Feb. 26, 2014

(86) PCT No.: PCT/EP2014/053672
§ 371 (c)(1),
(2) Date: Sep. 18, 2015

(87) PCT Pub. No.: WO2014/146873
PCT Pub. Date: Sep. 25, 2014

(65) Prior Publication Data
US 2016/0286677 A1  Sep. 29, 2016

(30) Foreign Application Priority Data
Mar. 18, 2013 (DE) .................. 10 2013 204 673

(51) Int. Cl.
*H05K 5/00* (2006.01)
*H05K 7/14* (2006.01)
(Continued)

(52) U.S. Cl.
CPC ......... *H05K 7/1432* (2013.01); *H05K 5/0247* (2013.01); *H05K 5/03* (2013.01)

(58) Field of Classification Search
CPC ...... H05K 7/1432; H05K 5/0247; H05K 5/03; H05K 5/00; H05K 5/0047; H05K 5/02;
(Continued)

(56) References Cited

U.S. PATENT DOCUMENTS 6,040,526 A * 3/2000 Olzak .................. H05K 5/0213
174/562
6,462,270 B1 * 10/2002 Depp ..................... H02G 3/081
174/50
(Continued)

FOREIGN PATENT DOCUMENTS

DE    102005015318    10/2006
DE    102011004625    8/2012
EP      1197397        4/2002

OTHER PUBLICATIONS

International Search Report for Application No. PCT/EP2014/053672 dated Jul. 3, 2014 (English Translation, 2 pages).

*Primary Examiner* — Angel R Estrada
(74) *Attorney, Agent, or Firm* — Michael Best & Friedrich LLP

(57) ABSTRACT

The invention relates to a control unit for an electric vehicle or hybrid vehicle. The control unit has a housing enclosing a cavity. The housing has a housing lid and a housing opening, wherein the housing lid is designed to close the housing opening. According to the invention, the control unit has an electrically insulating shock hazard protection cover, which has at least one projection region extending transversely with respect to a surface of the shock hazard protection cover. The housing lid has at least one receptacle for the projection region, wherein the cutout is designed to retain the projection region in a force-locking manner. The shock hazard protection cover has at least one latching hook designed to latch in a positively locking manner, or additionally in a force-locking manner, with the housing or a part of the control unit in the interior of the housing which is connected to the housing.

20 Claims, 3 Drawing Sheets

(51) Int. Cl.
*H05K 5/02* (2006.01)
*H05K 5/03* (2006.01)

(58) Field of Classification Search
CPC ...... H05K 5/0217; H05K 5/04; H05K 7/1427; H02G 3/08; H02G 3/081; H02G 3/088
USPC .................. 174/50, 520, 559, 561, 66, 560; 439/76.1, 76.2, 949
See application file for complete search history.

(56) References Cited

U.S. PATENT DOCUMENTS

| | | | |
|---|---|---|---|
| 6,948,982 B2* | 9/2005 | Higuchi | H01H 85/2045 174/50 |
| 6,982,873 B2* | 1/2006 | Meyer | H05K 7/20927 174/15.1 |
| 7,036,779 B2* | 5/2006 | Kawaguchi | F16B 5/0642 174/135 |

* cited by examiner

CONTROL UNIT FOR A MOTOR VEHICLE WITH A SHOCK HAZARD PROTECTION COVER

BACKGROUND OF THE INVENTION

The invention relates to a control unit for an electric vehicle or hybrid vehicle. The control unit has a housing enclosing a cavity. The housing has a housing lid and a housing opening, wherein the housing lid is designed to close the housing opening. The hybrid vehicle has at least one electric machine and additionally an internal combustion engine.

With control units known from the prior art there is the problem that, when the housing lid of the housing is opened, live parts in the interior of the housing can be contacted, thus posing a danger to a person who opens the housing.

SUMMARY OF THE INVENTION

In accordance with the invention the control unit of the type described in the introduction has an electrically insulating shock hazard protection cover, which has at least one projection region extending transversely with respect to a surface of the shock hazard protection cover. The housing lid has at least one receptacle, in particular a cutout or a clamp for the projection region, wherein the cutout is designed to securely hold the projection region with a frictional fit.

The shock hazard protection cover preferably has at least one latching hook, which is designed to latch, with a form fit or additionally with a frictional fit, with the housing or with part of the control unit that is located in the interior of the housing and that is connected to the housing. A force for releasing the latching of the shock hazard protection cover with the housing is preferably greater than a force for separating the shock hazard protection cover from the housing lid.

The housing lid together with the shock hazard protection cover thus can be connected advantageously to the housing part, and the projection region can be separated from the housing lid when the housing lid is opened, wherein the shock hazard protection cover can remain latched to the housing or the part of the control unit in the interior of the housing. More advantageously, the shock hazard protection cover thus can be connected to the housing lid in one manufacturing step.

During an assembly of the control unit, the housing lid can be assembled together with the shock hazard protection cover and is thus already connected to the housing lid in a predetermined position. When the control unit housing is to be opened, for example for maintenance or servicing purposes, the housing lid thus can be separated from the housing or swung open for this purpose. As the housing lid is separated or swings open, it can detach from the shock hazard protection cover, insofar as the shock hazard protection cover, by means of the frictional connection, is connected to the housing lid more weakly than to the housing or the part of the control unit in the interior of the housing by means of the interlocked connection. The shock hazard protection cover thus remains connected to the control unit and can hide live electrical components, which are concealed by the shock hazard protection cover, against accidental contact.

The control unit is preferably designed to control an electric machine for the movement of the electric vehicle or hybrid vehicle in motor operation and/or in generator operation and to be connected to the electric machine. To this end the control unit preferably has a connector for the electric machine. The control unit more preferably has an inverter, in particular a high-voltage inverter, for feeding current to the electric machine. The high-voltage inverter is designed to connect a voltage of more than 60 volts, preferably more than 400 volts, more preferably between 400 and 1500 volts, to an output connector for the electric machine.

The control unit is preferably designed to control a climate compressor and/or an electric heater and to supply these with operating voltage. To this end the control unit has an electrical connector for the climate compressor and/or the heater.

The shock hazard protection cover is preferably designed to cover at least one connector, in particular at least one of the connectors for the electric machine or the climate compressor or the heater.

In a preferred embodiment the shock hazard protection cover has a resilient seal formed integrally on the shock hazard protection cover. The seal is designed to seal at least an edge of the housing opening and the housing lid with respect to each other. The seal is preferably injection molded onto the shock hazard protection cover. The seal is preferably formed by an elastomer, more preferably by a silicone rubber. Due to the seal, moisture is advantageously prevented from infiltrating the housing.

The seal is preferably designed to protrude beyond an edge of the housing lid. In another embodiment the housing lid has, in the region of a housing lid edge, a cutout reaching as far as the seal. The seal can thus be seen advantageously from outside, and a presence of the shock hazard protection cover can be checked.

In a preferred embodiment the housing lid has at least one aperture, or a cutout for a screw. The housing preferably has a thread, in particular an inner thread for the screw, wherein the inner thread is arranged in such a way that the housing lid can be tightly screwed to the housing.

The housing lid thus can be separably connected to the housing, such that electrical components are accessible from outside for maintenance purposes.

The housing lid is preferably connected to the housing by means of a hinge, such that the housing lid can be swung open. The hinge can be formed for example as a latching hinge, which is designed such that the housing lid can be interlocked with the housing when connected for the first time to the housing and remains connected during an opening process following the connection to the housing via the hinge.

In a preferred embodiment the shock hazard protection cover has at least one aperture for passing through a probe tip of an electric voltmeter. The control device preferably comprises at least one electrical component, which is designed to convey high voltage. The electrical component is preferably arranged in the cavity enclosed by the housing. The shock hazard protection cover is preferably designed to cover the electrical component in such a way that the electrical component cannot be contacted through the housing opening.

The aperture for passing through the probe tip for example has a diameter between two and five millimeters.

By the aperture it is advantageously possible to test, once the housing lid has been opened, whether the electrical component is live. After the test the shock hazard protection cover can be removed by release of the latching, such that the electrical component is accessible through the housing opening for maintenance or servicing purposes.

In a preferred embodiment a retaining element is integrally formed on the shock hazard protection cover, which retaining element extends transversely with respect to the surface in a direction opposite the projection region. The retaining element is preferably shaped in the manner of a hollow cylinder portion or hollow-cylindrically. The retaining element is designed to engage around a head of a screw, in particular a hexagonal screw, and to securely hold the screw against loosening. A previously mentioned electrical component is preferably formed by means of the screw.

The screw is preferably part of an electrical connector for connection of the control unit, wherein the electrical connector is designed to be secured to a cable shoe of an electrical connector cable. To this end the electrical connector comprises the aforementioned screw, which can be securely held by the retaining element against loosening.

The previously mentioned cylinder wall for example may have incisions in the direction of a longitudinal extension of the hollow cylinder, such that cylinder wall segments thus formed, which are separated from one another by the incisions, can securely hold the screw head resiliently.

The shock hazard protection cover is preferably formed from, in particular, fiber-reinforced plastic. The plastic of the shock hazard protection cover preferably comprises polybutylene terephthalate. The aforementioned seal is preferably injection molded onto the shock hazard protection cover, and for example is formed from liquid silicone rubber.

The invention also relates to a method for making safe a control unit, in particular a control unit of the above-described type, comprising a housing enclosing a cavity, said method comprising the steps of:

frictionally connecting a shock hazard protection cover to an inner wall of a housing lid;

closing a housing opening of the housing with the housing lid, wherein the shock hazard protection cover latches with the housing or part of the control unit connected to the housing (said part preferably being received in the cavity), such that the shock hazard protection cover interlocks with the housing or part.

In the method a seal formed integrally on the shock hazard protection cover is preferably trapped between an opening edge of the housing opening and the housing lid as the housing opening is closed, such that the cavity is protected against infiltrating moisture.

BRIEF DESCRIPTION OF THE DRAWINGS

The invention will now be described hereinafter on the basis of figures and further exemplary embodiments. Further advantageous variants will emerge from the features described in the figures and in the dependent claims.

DETAILED DESCRIPTION

Figure 1:
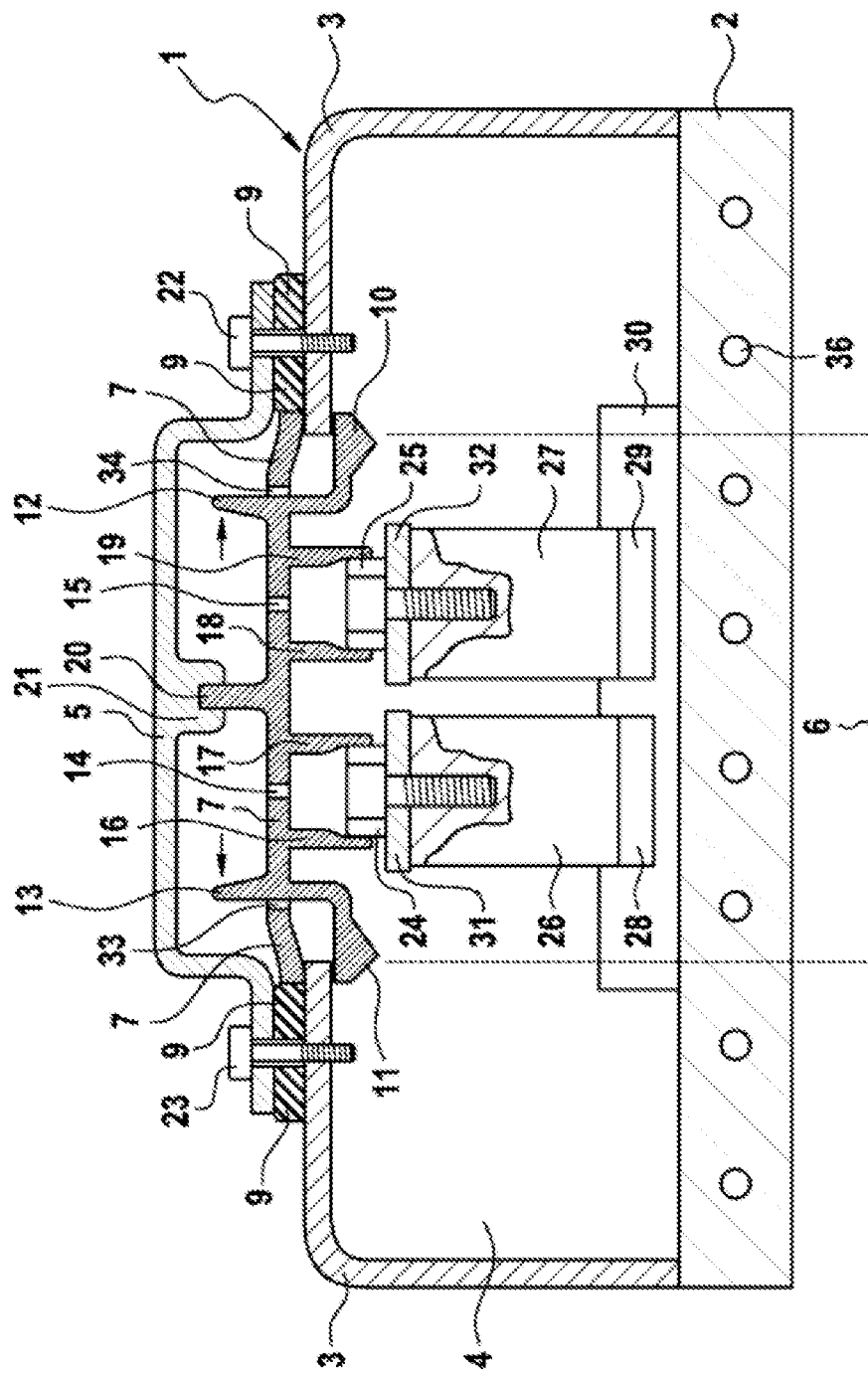
FIG. 1 schematically shows a control device in a sectional illustration, in which electrical connectors are accessible through a housing opening and are concealed by a shock hazard protection cover.

FIG. 1 shows an exemplary embodiment for a control unit 1 for a motor vehicle. The control unit 1 has a housing 3 enclosing a cavity 4. The housing 3 also has a housing lid 5, which is designed to close a housing opening 6 of the housing 3.

The cavity 4 enclosed by the housing 3 adjoins the opening 6 of the housing, such that electrical components arranged in the housing 3 can be reached from outside through the opening 6.

The control unit 1 in this exemplary embodiment has, as electrical components, a power output stage 30, which in this exemplary embodiment has two power semiconductors 28 and 29, which in this exemplary embodiment are each formed as a power transistor, in particular field-effect transistor or IGBT (IGBT=insulated gate bipolar transistor).

The power output stage 30 has an electrical connector 27 connected to the power transistor 29, and an electrical connector 26 connected to the power transistor 28. The electrical connector 26 has a screw connector with a screw 24, and the electrical connector 27 has a screw connector with a screw 25. The screw connectors 26 and 27 are designed to securely clamp and electrically contact a cable shoe 31 with the screw 24, and respectively a cable shoe 32 with the screw 25.

The control unit 1 also has a shock hazard protection cover 7. The shock hazard protection cover 7 is in this exemplary embodiment formed from plastic, in particular glass-fiber-reinforced polybutylene terephthalate, ABS plastic (ABS=acrylonitrile butadiene styrene), or an aliphatic polyamide, in particular a polyamide formed from hexamethylenediamine and adipic acid, in particular also known as PA66.

The shock hazard protection cover 7 has a sealing edge 9 as seal, which in this exemplary embodiment is formed integrally on the shock hazard protection cover 7. The sealing edge 9 is formed in this exemplary embodiment by a silicone rubber, in particular LSR. The sealing edge 9 is designed to seal the housing lid 5, in particular in the region of a lid edge of the housing lid 5, against the housing 3 in the region of an opening edge of the opening 6.

The seal 9 projects in the region of a lid edge of the housing lid beyond the lid edge, such that the presence of the shock hazard protection cover can be seen from outside. To this end the seal for example has a signal color, in particular one of the colors red, yellow or orange.

The control unit 1 in this exemplary embodiment for this purpose has a screw connection, by means of which the housing lid 5 can be connected to the housing 3. A screw 23 and a screw 22 are illustrated, which are each designed to connect the housing lid 5 to the housing 3 and to press the housing lid 5 against the housing 3 in the region of the opening edge of the opening 6.

The housing lid 5 has a receiving region 21 pointing in the direction of the cavity 4 and having a cutout. The receiving region 21 is designed to securely hold a projection region 20 with a frictional fit, wherein the projection region 20 is formed integrally on the shock hazard protection cover and extends toward the housing lid 5, pointing away from a flat extension of the shock hazard protection cover 7.

The shock hazard protection cover 7 in this exemplary embodiment also has two latching hooks 10 and 11, which each extend in the direction of the cavity 4 and are each formed integrally on the shock hazard protection cover 7.

The shock hazard protection cover 7 in this exemplary embodiment also has an actuation lever 13, which is arranged on the shock hazard protection cover 7 in the region of the latching hook 11 and extends in the direction of the lid 5, pointing away from the shock hazard protection cover 7. The shock hazard protection cover 7 also has an actuation lever 12, which extends in the direction of the lid 5 and is formed integrally on the shock hazard protection cover 7 in the region of the latching hook 10. The shock hazard protection cover 7 in the region of each of the actuation levers 13 and 12 has a slit 33 and 34 respectively, such that the actuation levers 13 and 12 can be resiliently pivoted. The shock hazard protection cover 7 is designed to also pivot the latching hook 11 as the actuation lever 13 is pivoted and to also pivot the latching hook 10 as the actuation lever 12 is pivoted. The latching hooks 10 and 11 are each designed and arranged to engage behind the edge of the housing opening 6 in a form-fitting manner. Following an actuation of the actuation levers, the latching hooks 10 and 11 are each pivoted away from the opening edge, such that the shock hazard protection cover 7 can be removed from the housing 3. In another embodiment the shock hazard protection cover does not have any actuation levers, and instead the latching hook is V-shaped or U-shaped in the region of an aperture in the shock hazard protection cover, wherein a V-limb or U-limb is formed integrally on the shock hazard protection cover, thus forming a resilient pivot joint. The latching hook has a projection region designed to engage behind the housing opening edge, which projection region is formed integrally on the U-limb or V-limb, pointing away therefrom. The latching hook can thus latch with the housing as the shock hazard protection cover is closed. In order to remove the shock hazard protection cover, the latching hook can be pivoted by leverage, by passing a lever tool, for example a screwdriver, through the aperture and into the V-shape or U-shape of the latching hook, such that the projection region can release the shock hazard protection cover.

The shock hazard protection cover 7 has a measurement opening 14, which is arranged in the region of the screw 24. The shock hazard protection cover 7 also has a measurement opening 15, which is arranged in the region of the screw 25.

The function of the control unit 1 will now be described hereinafter:

In order to assemble the control unit 1, the electrical connectors 26 and 27 can be connected to a cable shoe 31 and 32 respectively by means of the screw 24 and 25 respectively. The cable shoes 31 and 32 can be guided for example through a housing opening (not illustrated in greater detail in FIG. 1) of the housing 3 to the electrical connectors 26 and 27.

The shock hazard protection cover 7 can be introduced with the projection region 20, which in this exemplary embodiment is formed as a journal, with the housing lid 5 by inserting the journal 20 into the cutout of the receiving region 21 of the housing lid 5 and can thus be connected to the housing lid 5. Once the housing lid 5 has been connected to the shock hazard protection cover 7, the housing lid 5 together with the shock hazard protection cover 7 can be connected to the housing 3 and in so doing can close the housing opening 6.

When connecting the housing lid 5 together with the shock hazard protection cover 7 to the housing 3, the latching hooks 10 and 11 latch into the housing opening 6 and in so doing each engage behind the housing edge in the region of the housing opening 6.

In this exemplary embodiment a retaining element 16 and a retaining element 17 are also arranged on the shock hazard protection cover 7, which retaining elements are each formed as a hollow cylinder peripheral portion and are formed integrally on the shock hazard protection cover 7. The retaining elements 16 and 17 are designed to securely hold the screw 24 and to secure this against loosening. The shock hazard protection cover 7 also has two retaining elements 18 and 19, which are each formed as hollow cylinder peripheral portions and can jointly securely hold the screw 25. The hollow cylinder peripheral portions 16 and 17, similarly to the hollow cylinder peripheral portions 18 and 19, are each guided toward the screws 24 and 25 respectively as the housing opening 6 is closed and, in an end position in which the latching hooks 10 and 11 each snap into place, surround the screw heads of the screws 24 and 25 respectively.

Following a closure of the housing opening 6 of the housing 3, the housing lid 5 can be fixedly closed by means of the screws 23 and 22.

Here, the peripheral sealing edge 9 seals the gap between the lid 5 and the housing 3 against infiltrating moisture.

Figure 2:
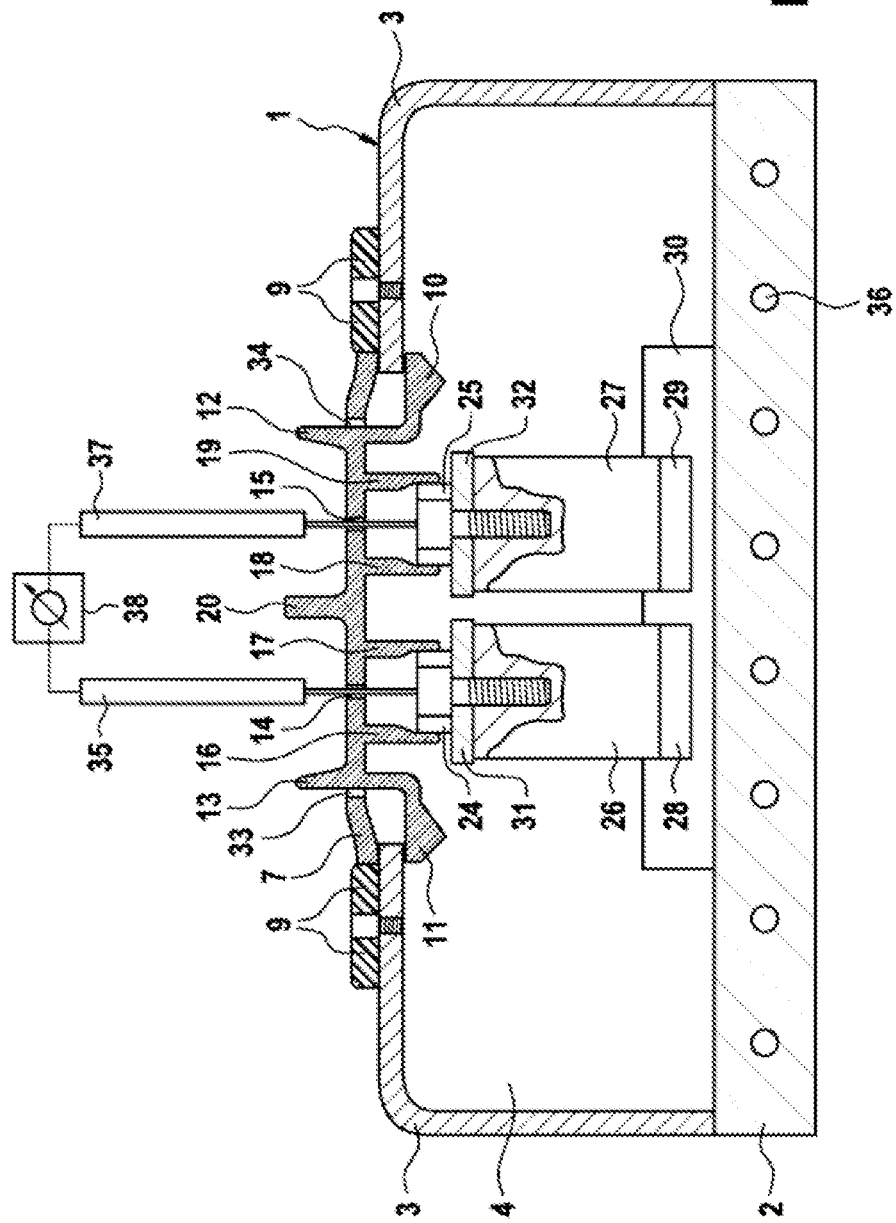
FIG. 2 shows the control unit shown in FIG. 1, in which the housing lid has been removed, wherein the shock hazard protection cover has separated from the housing lid and remains connected, in particular latched, to the control unit.

FIG. 2 shows the control unit illustrated in FIG. 1, in which the screws 22 and 23 have each been loosened and removed. The housing lid 5 illustrated in FIG. 1 has also been removed in the illustration of the control unit 2 shown in FIG. 2. The shock hazard protection cover 7 remains fixedly connected to the housing 3 by means of the latching hooks 10 and 11, whereas the projection region 20 connected only frictionally to the housing lid 5, in particular the receiving region 21, can be separated from the receiving region 21 when the housing lid 5 is removed from the housing 3. The shock hazard protection cover 7 thus remains advantageously connected to the housing 3, such that the electrical connectors 26 and 27, which for example are connected to a capacitor carrying high voltage, cannot be contacted from outside.

In a further test step, probe tips 35 and 37, illustrated in FIG. 2, of a measuring instrument 38 can be introduced into the measurement opening 14 and into the measurement opening 15 respectively, and in so doing can contact the screw 24 and the screw 25 respectively. By means of the measuring instrument 38, for example a voltmeter, it is thus possible to test whether the electrical connectors 26 and 27 are live.

When the electrical connectors 26 and 27 are each sufficiently de-energized, the shock hazard protection cover 7 can be removed by pivoting the actuation levers 12 and 13. Upon pivoting the actuation levers 12 and 13, the latching hooks 11 and 10 are also pivoted, such that the latching books 10 and 11 no longer engage in a form-fitting manner behind the housing edge in the pivoted state. The shock hazard protection cover 7 can then be removed.

Following a removal of the shock hazard protection cover 7, the screws 24 and 25 for example can be loosened, and, following a loosening of the screws 24 and 25, the cable shoes 31 and 32 can be separated from the electrical connectors 26 and 27.

The housing 3 also has a housing base 2, which has channels designed for fluid guidance. Of the channels, the channel 36 is referenced by way of example. The power output stage 30 is thermally conductively connected to the housing base 2. Heat produced by the output power stage 30 can thus be absorbed at the housing base 2, which for example is formed by a metal block, in particular aluminum block. The heat absorbed by the housing base 2 can be led away further, for example via a fluid flowing in the channels, in particular cooling water.

Figure 3:
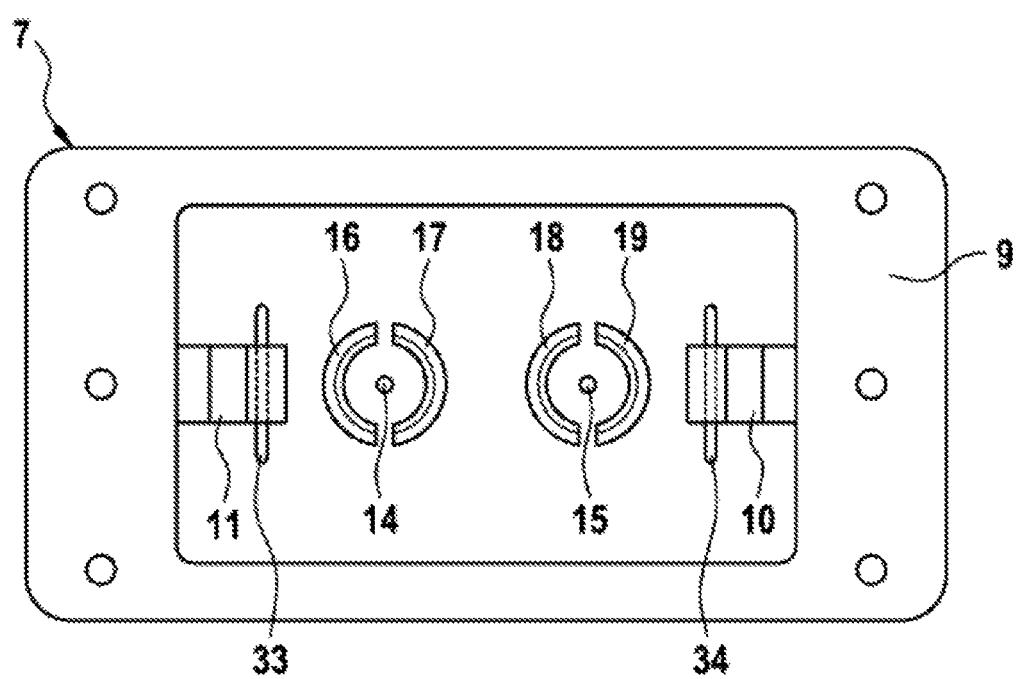
FIG. 3 shows in a plan view the shock hazard protection cover shown in FIG. 1.

FIG. 3 shows in a plan view the shock hazard protection cover 7 already illustrated in FIGS. 1 and 2. The seal formed as a peripheral sealing edge 9 is illustrated, which seal is formed integrally on the shock hazard protection cover 7. Retaining elements 16 and 17 are also illustrated, which each form segments of a hollow cylinder. The retaining elements 18 and 19 also jointly form segments of a hollow cylinder.

The retaining elements 16, 17, 18 and 19 are each formed integrally on the shock hazard protection cover 7, in particular are injection molded on and extend in a manner pointing away from a flat extension of the shock hazard protection cover 7. The shock hazard protection cover can be produced for example in an injection molding method.

The latching hooks 10 and 11 are also illustrated, wherein the shock hazard protection cover 7 has, in the region of the latching hooks 10 and 11, slits 33 and 34 respectively, each extending longitudinally. The shock hazard protection cover 7 can thus deflect in the region of the slits 33 and 34 upon actuation of the actuation levers 13 and 12 illustrated in FIG. 1. The latching hooks 11 and 10 can thus be pivoted and can release the form-fitting engagement, formed by means of the latching hooks 10 and 11 and illustrated in FIG. 1, behind the opening edge of the housing opening 6.

The measurement opening 14 is arranged in this exemplary embodiment in a middle of the hollow cylinder formed by means of the retaining elements 16 and 17. The measurement opening 15 is arranged in this exemplary embodiment in a middle of the hollow cylinder formed by the retaining elements 18 and 19. The screw arranged under the shock hazard protection cover can thus be touched, and a voltage conveyed by the screw can thus be measured.

What is claimed is:

1. A control unit (1) for an electric vehicle or hybrid vehicle, the control unit (1) comprising:
    a housing (3) enclosing at least one cavity (4), wherein the housing (3) has a housing lid (5) and a housing opening (6), wherein the housing lid (5) is configured to close the housing opening (6); and
    an electrically insulating shock hazard protection cover (7), which has at least one projection region (20) extending transversely with respect to a surface of the shock hazard protection cover (7),
    wherein the housing lid (5) has at least one receptacle (21) for the projection region (20), which receptacle (21) is configured to securely hold the projection region (20) with a frictional fit,
    wherein the shock hazard protection cover (7) has at least one latching hook (10, 11), wherein the latching hook (10, 11) is configured to latch, with a form fit or additionally with a frictional fit, with the housing (3), and
    wherein a force required for releasing the at least one latching hook (10, 11) from the housing (3) is greater than a force required for separating the shock hazard protection cover (7) from the housing lid (5) so that, when the at least one receptacle (21) is holding the projection region (20) with a frictional fit and the housing lid (5) is moved away from the housing opening (6), the housing lid (5) is separated from the shock hazard protection cover (7) and the shock hazard protection cover (7) remains latched with the housing (3) via the at least one latching hook (10, 11).

2. The control unit (1) as claimed in claim 1, characterized in that the shock hazard protection cover (7) has a resilient seal (9) seal formed integrally on the shock hazard protection cover (7), which seal is designed to seal at least an edge of the housing opening (6) and the housing lid (5) with respect to each other.

3. The control unit (1) as claimed in claim 2, characterized in that the housing lid has at least one aperture or a cutout for a screw arranged in such a way that the housing lid can be tightly screwed to the housing.

4. The control unit (1) as claimed in claim 1, characterized in that the shock hazard protection cover (7) has at least one aperture (14, 15) for passing through a probe tip (35, 37) of an electric voltmeter (34).

5. The control unit (1) as claimed in claim 1, characterized in that a retaining element (16, 17, 18, 19) is integrally formed on the shock hazard protection cover (7), which retaining element extends transversely with respect to the surface in a direction opposite the projection region (20) and which is shaped in the manner of a hollow cylinder portion or hollow-cylindrically and is configured to engage around a head of a screw (24, 25) and to securely hold the screw (24, 25) against detachment.

6. The control unit (1) as claimed in claim 1, characterized in that the shock hazard protection cover (7) is formed from fiber-reinforced plastic.

7. The control unit (1) as claimed in claim 6, characterized in that the plastic of the shock hazard protection cover (7) comprises polybutylene terephthalate.

8. The control unit (1) as claimed in claim 2, characterized in that the seal (9) comprises silicone rubber.

9. The control unit (1) as claimed in claim 2, characterized in that the housing lid has at least one aperture or a cutout for a screw, wherein the housing has a thread, and wherein the thread is arranged in such a way that the housing lid can be tightly screwed to the housing.

10. The control unit (1) as claimed in claim 2, characterized in that the housing lid has at least one aperture or a cutout for a screw, wherein the housing preferably has an inner thread for the screw, and wherein the inner thread is arranged in such a way that the housing lid can be tightly screwed to the housing.

11. The control unit (1) as claimed in claim 1, wherein the shock hazard protection cover (7) includes an actuation lever (12, 13), which extends in the direction of the housing lid (5), and a slit (33, 34), which is in the region of the latching hook (10, 11), such that the actuation lever (12, 13) can be resiliently pivoted, and wherein the shock hazard protection cover (7) is designed to pivot the latching hook (10, 11) as the actuation lever (12, 13) is pivoted.

12. The control unit (1) as claimed in claim 2, wherein the sealing edge (9) projects beyond a lid edge of the housing lid (5) such that the presence of the shock hazard protection cover (7) can be seen from the outside.

13. The control unit (1) as claimed in claim 12, wherein the sealing edge (9) has a signal color, and wherein the signal color is one of red, yellow, and orange.

14. A control unit (1) for an electric vehicle or hybrid vehicle, the control unit (1) comprising:
    a housing (3) enclosing at least one cavity (4), wherein the housing (3) has a housing lid (5) and a housing opening (6), wherein the housing lid (5) is configured to close the housing opening (6); and
    an electrically insulating shock hazard protection cover (7), which has at least one projection region (20) extending transversely with respect to a surface of the shock hazard protection cover (7),
    wherein the housing lid (5) has at least one receptacle (21) for the projection region (20), which receptacle (21) is configured to securely hold the projection region (20) with a frictional fit,
    wherein the shock hazard protection cover (7) has at least one latching hook (10, 11), wherein the latching hook (10, 11) is configured to latch, with a form fit or additionally with a frictional fit, with the housing (3), and wherein the shock hazard protection cover (7) has a resilient seal (9) seal formed integrally on the shock hazard protection cover (7), which seal is designed to seal at least an edge of the housing opening (6) and the housing lid (5) with respect to each other.

15. The control unit (1) as claimed in claim 14, characterized in that the housing lid has at least one aperture or a cutout for a screw arranged in such a way that the housing lid can be tightly screwed to the housing.

16. The control unit (1) as claimed in claim 14, characterized in that the housing lid has at least one aperture or a cutout for a screw, wherein the housing has a thread, and wherein the thread is arranged in such a way that the housing lid can be tightly screwed to the housing.

17. The control unit (1) as claimed in claim 14, characterized in that the housing lid has at least one aperture or a cutout for a screw, wherein the housing preferably has an inner thread for the screw, and wherein the inner thread is arranged in such a way that the housing lid can be tightly screwed to the housing.

18. A method for making safe a control unit (1) having a housing (3) enclosing a cavity (4), said method comprising the steps of:
   frictionally connecting a shock hazard protection cover (7) to an inner wall of a housing lid (5); and
   closing a housing opening (6) of the housing (3) with the housing lid (5), wherein the shock hazard protection cover (7) latches with the housing (3) or part of the control unit (1) connected to the housing (3), such that the shock hazard protection cover (7) interlocks with the housing (3) or part of the control unit (1), and
   wherein a force required for releasing the engagement of the shock hazard protection cover (7) with the housing (3) is greater than a force required for separating the shock hazard protection cover (7) from the housing lid (5).

19. The method as claimed in claim 18, in which a seal (9) formed integrally on the shock hazard protection cover (7) is trapped between an opening edge of the housing opening (6) and the housing lid (5) as the housing opening (6) is closed, such that the cavity (4) is protected against infiltrating moisture.

20. A control unit (1) for an electric vehicle or hybrid vehicle, the control unit (1) comprising:
   a housing (3) enclosing at least one cavity (4), wherein the housing (3) has a housing lid (5) and a housing opening (6), wherein the housing lid (5) is configured to close the housing opening (6); and
   an electrically insulating shock hazard protection cover (7), which has at least one projection region (20) extending transversely with respect to a surface of the shock hazard protection cover (7),
   wherein the housing lid (5) has at least one receptacle (21) for the projection region (20), which receptacle (21) is configured to securely hold the projection region (20) with a frictional fit,
   wherein the shock hazard protection cover (7) has at least one latching hook (10, 11), wherein the latching hook (10, 11) is configured to latch, with a form fit or additionally with a frictional fit, with the housing (3), and
   wherein a retaining element (16, 17, 18, 19) is integrally formed on the shock hazard protection cover (7), which retaining element extends transversely with respect to the surface in a direction opposite the projection region (20) and which is shaped in the manner of a hollow cylinder portion or hollow-cylindrically and is configured to engage around a head of a screw (24, 25) and to securely hold the screw (24, 25) against detachment.

\* \* \* \* \*